United States Patent
Snider et al.

(10) Patent No.: US 8,004,876 B2
(45) Date of Patent: Aug. 23, 2011

(54) CONFIGURABLE MOLECULAR SWITCH ARRAY

(75) Inventors: Gregory S. Snider, Mountain View, CA (US); Philip J. Kuekes, Menlo Park, CA (US); R. Stanley Williams, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 2830 days.

(21) Appl. No.: 10/233,232

(22) Filed: Aug. 30, 2002

(65) Prior Publication Data

US 2004/0041617 A1    Mar. 4, 2004

(51) Int. Cl.
*G11C 11/00*    (2006.01)
(52) U.S. Cl. .................. 365/151; 365/174; 365/175
(58) Field of Classification Search .......... 257/295–306, 257/104–106; 365/151, 174–175
See application file for complete search history.

(56) References Cited

U.S. PATENT DOCUMENTS

| | | | |
|---|---|---|---|
| 4,972,370 A * | 11/1990 | Morimoto et al. ............ 365/106 |
| 5,790,771 A | 8/1998 | Culbertson et al. |
| 6,128,214 A * | 10/2000 | Kuekes et al. ................ 365/151 |
| 6,256,767 B1 | 7/2001 | Kuekes et al. |
| 6,294,450 B1 | 9/2001 | Chen et al. |
| 6,298,453 B1 | 10/2001 | Culbertson et al. |
| 6,314,019 B1 * | 11/2001 | Kuekes et al. ................ 365/151 |
| 6,407,443 B2 | 6/2002 | Chen et al. |
| 6,432,740 B1 | 8/2002 | Chen et al. |
| 6,459,095 B1 | 10/2002 | Heath et al. |
| 6,559,468 B1 | 5/2003 | Kuekes et al. |
| 2002/0127756 A1 * | 9/2002 | Wessels et al. ................ 438/39 |
| 2003/0169618 A1 * | 9/2003 | Lindsey et al. ............... 365/151 |
| 2004/0257736 A1 * | 12/2004 | Goldstein et al. ............ 361/93.1 |

FOREIGN PATENT DOCUMENTS

| | | |
|---|---|---|
| JP | 1994-318864 | 11/1994 |
| JP | 1995-099439 | 4/1995 |
| JP | 2001-284572 | 10/2001 |

OTHER PUBLICATIONS

M. Gudiksen et al, "Growth of Nanowire Superlattice Structures for Nanoscale Photonics and Electronics," Nature, col. 415, Feb. 7, 2002, pp. 617-620.
Heath, James R. et al, "Chemically Synthesized and Assembled Electronic Devices", Patent Application 10981971-1, U.S. Appl. No. 09/282,048, Confirmation No. 8109, filed Mar. 29, 1999.

(Continued)

Primary Examiner — H. Jey Tsai
(74) Attorney, Agent, or Firm — David W. Collins

(57) ABSTRACT

A computing system for implementing at least one electronic circuit with gain comprises at least one two-dimensional molecular switch array. The molecular switch array is formed by assembling two or more crossed planes of wires into a configuration of devices. Each device comprises a junction formed by a pair of crossed wires and at least one connector species that connects the pair of crossed wires in the junction. The junction has a functional dimension in nanometers, and includes a switching capability provided by both (1) one or more connector species and the pair of crossed wires and (2) a configurable nano-scale wire transistor having a first state that functions as a transistor and a second state that functions as a conducting semiconductor wire. Specific connections are made to interconnect the devices and connect the devices to two structures that provide high and low voltages.

4 Claims, 12 Drawing Sheets

OTHER PUBLICATIONS

Zhang, Xiao-An et al, Bistable Molecular Mechanical Devices with a Band Gap Change Activated by an Electric Field for Electronic Switching, Gating, and Memory Applications, Patent Application 10010538-1, U.S. Appl. No. 09/823,185, filed Mar. 29, 2001.

Eaton, James R. et al, "Molecular Wird Crossbar Flash Memory," Patent Application 100202292-1, U.S. Appl. No. 10/138,076, filed May 13, 2002.

Kuekes, Philip J. et al, "Molecular Wird Transistor (MWT)," Patent Application 10981967-1, U.S. Appl. No. 09/699,080, filed Oct. 26, 2000.

Hewlett-Packard Development Company, L.P.. "Configurable Molecular Switch Array", TW Application No. 92123928, TW Search Report, Mar. 6, 2009.

Intersil, Datasheet for CA3096 NPN/PNP Transistor Arrays, Dec. 1997.

* cited by examiner

CONFIGURABLE MOLECULAR SWITCH ARRAY

TECHNICAL FIELD

The present invention relates generally to electronic devices whose functional length scales are measured in nanometers, and, more particularly, to configurable molecular switch arrays based on crossed nanometer-scale wires joined by bi-stable molecular scale switches at the intersecting junctions.

BACKGROUND ART

The silicon integrated circuit and its continued miniaturization has created an electronics industry that is now facing its limit due to economic and physical constraints. Current integrated circuit devices are being manufactured using submicron scale dimensions, while new solutions are enabling the development of nanometer scale devices.

Prior proposed solutions to the problem of constructing nanometer scale devices have involved (1) the utilization of extremely fine scale lithography using X-rays, electrons, ions, scanning probes, or stamping to define the device components; (2) direct writing of the device components by electrons, ions, or scanning probes; or (3) the direct chemical synthesis and linking of components with covalent bonds. The major problem with (1) is that the wafer on which the devices are built must be aligned to within a small fraction of the size of the device features in at least two dimensions for several successive stages of lithography, followed by etching or deposition to build the devices. This level of control does not scale well as device sizes are reduced to nanometer scale dimensions. It becomes extremely expensive to implement as devices are scaled down to nanometer scale dimensions. The major problem with (2) is that it is a serial process, and direct writing a wafer full of complex devices, each containing trillions of components, could well require many years. Finally, the problem with (3) is that high information content molecules are typically macromolecular structures such as proteins of DNA, and both have extremely complex and, to date, unpredictable secondary and tertiary structures that cause them to twist into helices, fold into sheets, and form other complex 3D structures that will have a significant and usually deleterious effect on their desired electrical properties as well as make interfacing them to the outside world impossible.

The problem of building a physical digital circuit as opposed to only a set of digital devices, is to connect a set of devices with a physical interconnect which is topologically equivalent to the logical net list of the logic design that is being implemented. The construction of a computer system requires the design and interconnection of more complex functional elements such as processors, memories and input/output devices. Nanometer scale devices have been developed for providing specific functions including memory as disclosed in U.S. Pat. No. 6,128,214, "Molecular Wire Crossbar Memory", issued to Philip J. Kuekes et al on Oct. 3, 2000, and for input/output and signal routing as disclosed in U.S. Pat. No. 6,256,767, "Demultiplexer for a Molecular Wire Crossbar Network", issued to Philip J. Kuekes et al on Jul. 3, 2001, and in U.S. Pat. No. 6,314,019B1, "Molecular-Wire Crossbar Interconnect (MWCI) for Signal Routing and Communications", issued to Philip J. Kuekes et al on Nov. 6, 2001; all three patents are assigned to the same assignee as the present invention. The contents of these three patents are expressly incorporated herein by reference.

A need exists for the development, fabrication and integration of nanometer scale devices that can implement complex functional elements and be readily manufactured.

DISCLOSURE OF INVENTION

In accordance with the embodiments disclosed herein, a computing system for implementing one or more electronic circuits with gain is provided. The computing system comprises one or more two-dimensional molecular switch arrays. The molecular switch array is formed by assembling two or more crossed planes of wires into a configuration of devices. Each device comprises a junction formed by a pair of crossed wires where one wire crosses another, and at least one connector species that connects the pair of crossed wires in the junction. The junction has a functional dimension in nanometers, and includes at least one switching capability provided by both (1) one or more connector species and the pair of crossed wires, and (2) a configurable transistor having a first state that functions as a transistor and a second state that functions as a conducting semiconductor wire. At least one of the devices on one of the molecular switch arrays is configured to implement one or more of the electronic circuits. Specific connections are made to interconnect the devices and to connect the devices to two structures that provide voltages equal to a desired signal level for a high voltage level and a low voltage level.

The molecular switch arrays formed provide the advantages of economic fabrication and configuration of complex functional elements for the construction of computer systems. Another advantage is signal restoration or the ability to restore the logic levels of the signals by providing structures to create gates and inverters with gain. Still another advantage of the arrays is their ability to implement a specific interconnection of devices to form NAND gates, which are the universal components for realizing any logical computational function. Thus, rather complex logical functions can be implemented with minimal signal degradation.

The molecular switch arrays also exhibit significant defect tolerance. Since there is no requirement that any pair of vertical or horizontal wires be adjacent each other or have any other particularly geometric or topological relationship, defective horizontal or vertical wires (defective either due to breaks or shorts in the wires, or the failure to form working devices at their junctions with other wires) can simply be ignored, and the array implemented with whatever horizontal and vertical wires are functional. Also, the functional differentiation of the arrays into different regions or quadrants need not be sharply defined nor have the same size, as long as the junctions of the array can be characterized. The array is highly tolerant to variations in the fabrication of the quadrants. Thus, the array is extremely easy to route and configure, making it easy to route signals from inputs to outputs, particularly in the presence of defects.

BEST MODES FOR CARRYING OUT THE INVENTION

Definitions

As used herein, the term "reconfigurable" means that a switch can change its state multiple times via a reversible process such as an oxidation or reduction; in other words, the switch can be opened and closed multiple times such as the memory bits in a random access memory.

The term "bi-stable" as applied to a molecule means a molecule having two relatively low energy states. The molecule may be either irreversibly switched from one state to the other (singly configurable) or reversibly switched from one state to the other (reconfigurable).

The term "micron-scale dimensions" refers to dimensions that range from 1 micrometer to a few micrometers in size.

The term "sub-micron scale dimensions" refers to dimensions that range from 1 micrometer down to 0.04 micrometers.

The term "nanometer scale dimensions" refers to dimensions that range from 0.1 nanometers to 50 nanometers (0.05 micrometers).

A crossbar is an array of switches that connect each wire in one set of parallel wires to every member of a second set of parallel wires that intersects the first set (usually the two sets of wires are perpendicular to each other, but this is not a necessary condition).

Crossed Wire Switch (or Crosspoint Switch)

In related patent application Ser. No. 09/280,048 ("Chemically Synthesized and Assembled Electronic Devices"), the contents of which are expressly incorporated herein by reference, a basic scheme for chemically synthesized and assembled electronic devices is provided. That application discloses and claims a quantum state switch that comprises an adjustable tunnel junction between two nanometer scale wires. In accordance with that invention, an electronic device is provided, comprising two crossed wires having nanometer dimensions, provided with functionalizing groups that control conductivity type of the wires. A plurality of such crossed wires may be assembled to provide a variety of different devices and circuits.

That invention enables the construction of electronic devices on a nanometer scale using relatively stiff wires that are chemically functionalized to provide the desired electronic properties and which are then chemically-assembled to create active electronic devices simply by forming contact with other wires.

Reference is made now in detail to a specific embodiment of the present invention, which illustrates the best mode presently contemplated by the inventors for practicing the invention. Alternative embodiments are also briefly described as applicable.

Figure 1:
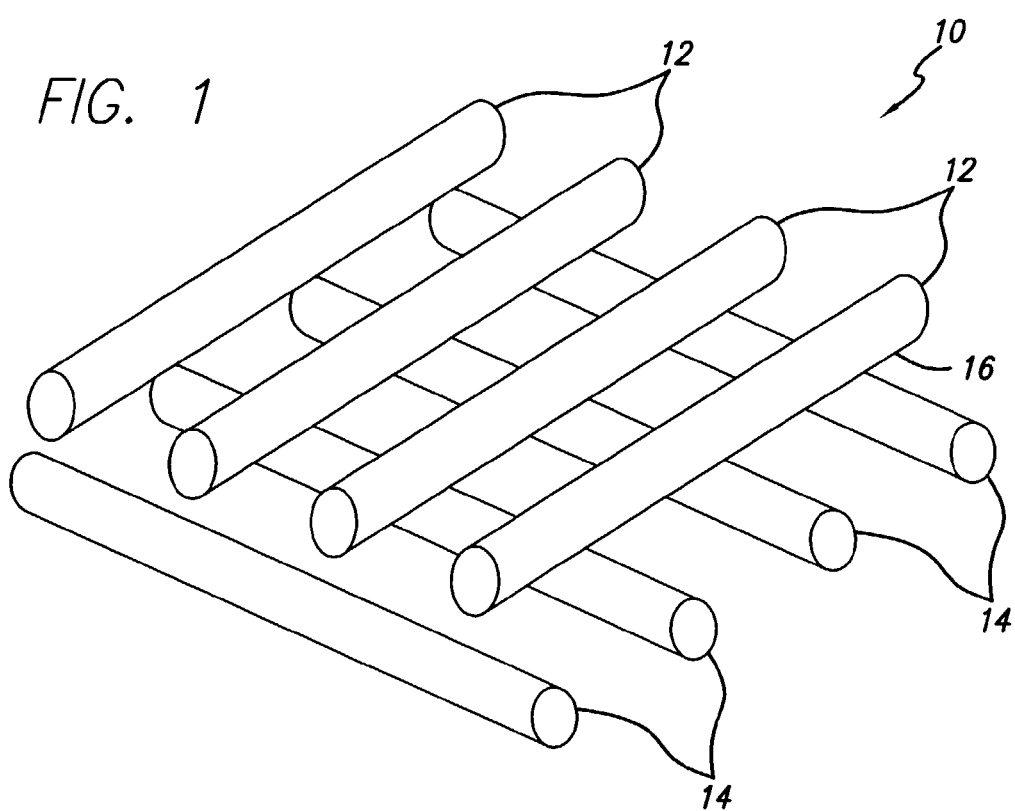
FIG. 1 is a perspective view of two planes of wires.
Figure 2:
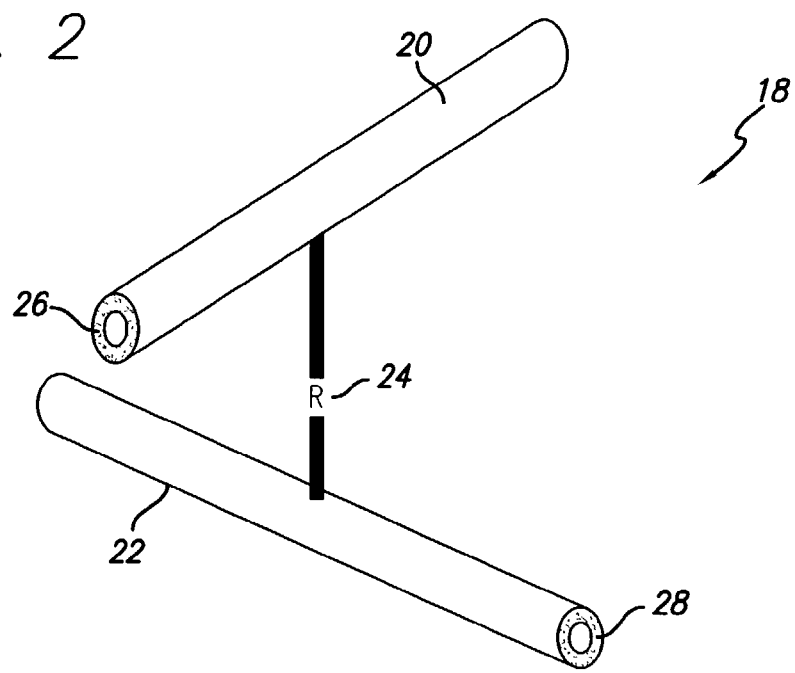
FIG. 2 is a schematic representation of a crossed wire switch or crosspoint switch comprising two crossed nanometer scale wires, with at least one molecule bridging the gap employed in accordance with the teachings herein.

FIG. 1 provides a perspective view of an embodiment of a two dimensional molecular switch array 10. The molecular switch array 10 is formed by assembling two crossed planes of wires 12, 14 into a configuration of devices. The device comprises a junction 16 formed by a pair of crossed wires where one wire crosses another and one or more connector species connecting the pair of crossed wires in the junction 16. The device, a crossed wire switch or a crosspoint switch 18, is depicted in FIG. 2 and comprises two nanometer scale wires 20, 22 each either a conductor or semiconductor wire, that are crossed at some non-zero angle. In between those wires is a layer of molecules or molecular compounds 24, denoted R and identified as switch molecules. When an appropriate voltage is applied across the wires, the switch molecules are either oxidized or reduced; see above-referenced U.S. Pat. No. 6,314,019. Alternatively, as described below, the switch molecule 24, or a portion thereof, may undergo a mechanical movement between two states.

Further, FIG. 2 depicts a coating 26 on wire 20 and a coating 28 on wire 22. The coatings 26, 28 may be modulation-doping coatings, tunneling barriers (e.g., oxides), or other nanometer scale functionally suitable materials. Electronic devices 18 can be formed with a size on the order of tens of nanometers to a few nanometers simply by making contact between two wires. By choosing the molecules, which form a doping layer on the wires (modulation doping), it is possible to build devices with a wide variety of specifically desired electrical properties. The electronic device 18 in its simplest state is a quantum state switch comprising an adjustable tunnel junction 24 between two nanometer scale wires 20, 22. The wires are provided with a connector species that, in one embodiment, is bi-stable. The connector species may comprise a dielectric (e.g., oxide, nitride) hot electron trap region, or a molecular species. The molecular species is addressed by setting voltages on the appropriate two wires. Thus, by the simple process of crossing one type of coated wire over the other, a switch is formed at wherever the intersection occurs. Furthermore, in one embodiment, the chemical species that form the molecular link between the wires can be electrochemically oxidized or reduced.

The above-identified co-pending application Ser. No. 09/280,048 describes a number of processes to produce discrete crossed wire pairs, such as shown in FIG. 1. Also disclosed therein is a process for preparing devices made from redox pairs of micrometer-scale wires.

Molecular switching components may come from any number of different classes of molecules, depending, again, on the desired properties of the device. The key requirement of the molecules is that, when they are sandwiched between two electrodes, they may be electrochemically modified (i.e., oxidized or reduced) by applying a voltage between the electrodes. When the molecular components are so modified, the net effect is that a barrier, e.g., a tunneling barrier, between the two wires is modified, and the rate of current flow is changed. This forms the basis of a switch that can, in turn, be used for memory, logic operations, and communication and signal routing networks. Molecular switches can include redox pairs of molecules, in which application of a voltage reduces one of the molecules and oxidizes the other.

In the foregoing embodiment, the connector species 24 may comprise a material that displays a significant, or measurable, hysteresis in its current-voltage curve, obtained from current-voltage characteristics in a solid-state junction. Examples of such species include metalocenes, rotaxanes, pseudo-rotaxanes, catenanes, and spiropyrans.

In another embodiment, the connector species may comprise a material that evidences switching based on electric (E) field induced band gap changes that have been discovered. These materials are the subject of a co-pending patent application Ser. No. 09/823,195, filed on Mar. 29, 2001, entitled "Bistable Molecular Mechanical Devices with a Band Gap Change Activated by an Electric Field for Electronic Switching, Gating, and Memory Applications", by Xiao-An Zhang et al and assigned to the same assignee as the present application, the contents of which are expressly incorporated herein. Three primary mechanisms are disclosed and claimed; one of the mechanisms has two different approaches. The mechanisms are:

(1) Electric field ("E-field") induced rotation of at least one rotatable section (rotor) of a molecule to change the band gap of the molecule (rotor/stator configuration);

(2) E-field induced charge separation or recombination of the molecule via chemical bonding change to change the band gap:
 (2a) E-field-induced band gap change caused by the change of extended conjugation via charge separation or recombination accompanied by increasing or decreasing $\pi$- and/or p-electron localization,
 (2b) E-field-induced band gap change caused by change of extended conjugation via charge separation or recombination and $\Sigma$-bond breaking or formation; and (3) E-field induced band gap change via molecular folding or stretching.

The foregoing description of switching molecules is merely exemplary, and the embodiments of the various arrays disclosed herein can employ any switching molecule, regardless of its switching mechanism. All such switching molecules are characterized by having at least two separate states, preferably two (bi-stable) (to form logic-0 and logic-1). Switching between the states may be done once (irreversible) or multiple times (reversible).

Figure 3:
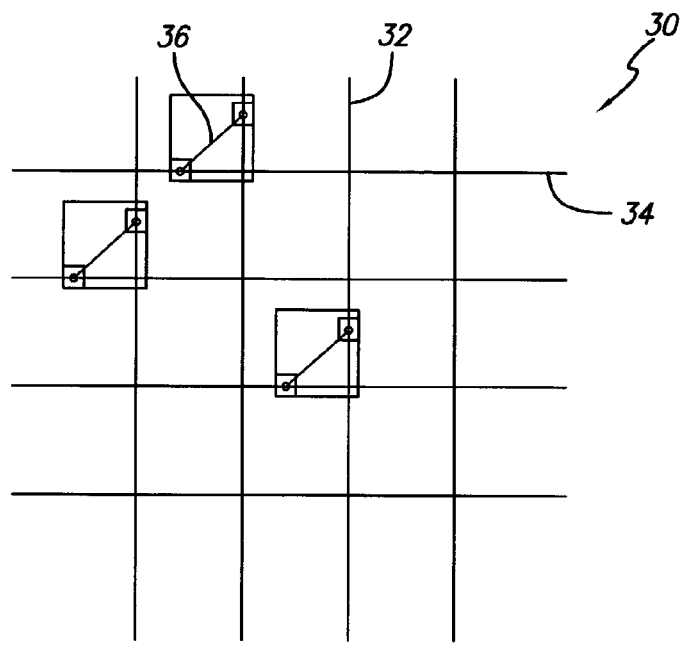
FIG. 3 is a schematic representation of a crossbar switch depicting a configured switch at a junction as a short circuit between the horizontal and vertical wires of the junction.

In FIG. 3, a plurality of sets of wires 32, 34, one set configured at an angle to the other, provides a two dimensional array 30 of crossbar or crosspoint switches 36 where a single switch is formed by the wires 32, 34 and a molecular species (not shown) located in between the wires. Each switch 36 can be programmed to be closed, thereby allowing current to flow between the horizontal and vertical wires that it connects, or open, where no connection is established between the two wires 32 and 34. Other functionalities that can be achieved by the crossbar switch array are detailed in above-referenced U.S. Pat. No. 6,128,214.

Figures 4A, 4B:
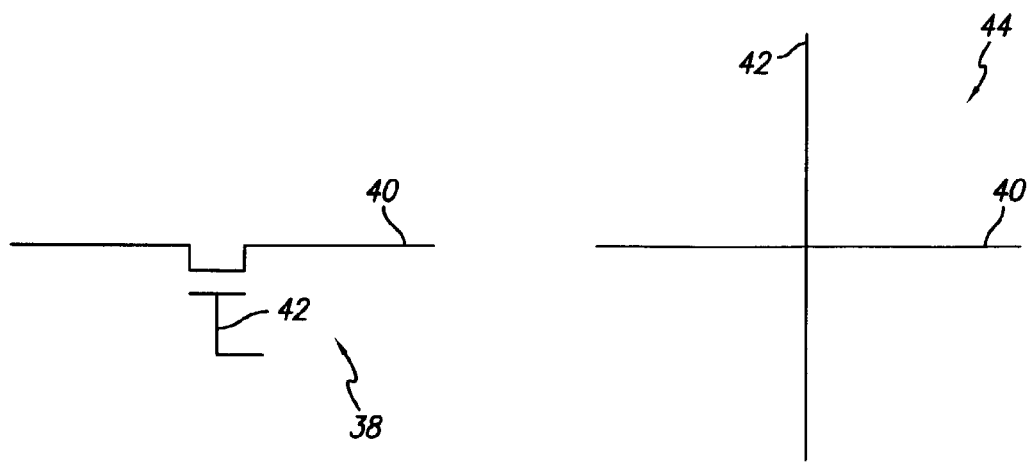
FIGS. 4a-4b depict a special transistor that can be configured at the junction of two crossed wires into one of two states: transistor (FIG. 4a) or a conducting semiconductor wire (FIG. 4b)

FIGS. 4a and 4b depict an example of a configurable transistor that can be configured and reconfigured into one of two different states, as described in above-referenced U.S. Pat. No. 6,256,767, as well as application Ser. No. 10/138,076, filed May 13, 2002, entitled "Molecular Wire Crossbar Flash Memory" and filed in the names of James R. Eaton, Jr. et al and assigned to the same assignee as the present application. However, this example is not limiting; for another example, see application Ser. No. 09/699,080, filed Oct. 26, 2000, which is a divisional of application Ser. No. 09/280,188, filed Mar. 29, 1999, now abandoned, entitled "Molecular Wire Transistor (MWT)" and filed in the names of Philip J. Kuekes et al and assigned to the same assignee as the present application. The contents of the foregoing two patent applications are expressly incorporated herein by reference. Finally, the transistor shown in FIG. 4a is a field effect transistor (FET). It will be appreciated that bipolar transistors may alternately be employed in the practice of the teachings herein.

The transistor in the first state 38 (FIG. 4a) acts like a field effect transistor (FET) with the source and drain formed by a horizontal wire 40 near the junction of a vertical wire 42 that forms the gate. When the voltage on the vertical wire is set to a low voltage level, then the FET formed at the junction is put into a high impedance state and effectively blocks current flow in the horizontal wire 40 through the junction. When the voltage on the vertical wire 42 is set to a high level, then the FET is put into a lower impedance state and allows current to flow in the horizontal wire 40 in either direction.

The transistor in the second state 44 (FIG. 4b) has a horizontal wire 40 that is put into a low impedance state in the junction regardless of whether the vertical wire 42 in that junction is in the low voltage or high voltage state. In the latter case, wires 40 and 42 are not electrically connected. The voltage on wire 42 has no influence on the current flowing in wire 40.

In another embodiment as taught in the above-referenced application Ser. No. 10/138,076, a configurable nanowire transistor is provided, comprising (a) a pair of crossed nanowires, one of the nanowires comprising a semiconductor material having a first conductivity and the other nanowire comprising either a metal or a second semiconductor material, and (b) a dielectric or molecular species to trap and hold hot electrons. The nano-scale wire transistor either forms a configurable transistor or a switch memory bit that is capable of being set by application of a voltage that is larger in absolute magnitude than any voltage at which the transistor operates. The pair of wires cross at a closest distance of nanometer scale dimensions and at a non-zero angle.

Eaton, Jr. et al also teach that FETs are fabricated using a crossbar array, comprising a two-dimensional array of crossed wires, in which one plurality of wires comprises a semiconductor material and the other plurality of wires comprises a metal. The semiconductor wires become the transistor and the metal wires induce formation of a gate in the semiconductor wire. A molecular species at the junction of each wire pair creates a sufficient standoff distance from the metal wire to insulate it from the gate, which is formed between source and drain regions defined by the creation of the gate in the semiconductor wire.

In yet another embodiment, a memory effect (trapped hot electron considered as a configuration state) may be incorporated into the nano-scale transistor. By providing an electron trap, it then becomes possible to have a special type of transistor. The electron trap comprises either the dielectric with charge-holding defects discussed above or the molecular species discussed above.

If the configuration state is not set (no electrons in the trap), then a transistor is formed, but if the configuration state is set (electrons in the trap), then either an open or closed switch is formed. Whether a switch is open or closed depends on whether the gated region of the transistor conducts with electrons or holes. If the transistor conducts with electrons, then one or more electrons in the trap will form an open switch. If the transistor conducts with holes, then one or more electrons in the trap will form a closed switch.

One example of a molecule advantageously employed as an electron trap in practicing the embodiments disclosed therein comprises a molecule having a structure represented as

I-M-I'.

where M represents a conjugated moiety having a relatively smaller HOMO-LUMO value (to make it effectively metallic-like) and where I and I' represent an insulator portion of the molecule that is connected to the nano-scale wires 42, 44, with I and I' the same or different and having a relatively higher HOMO-LUMO value. The presence of the two insulating moieties I and I' serve to separate, and control the distance of, the M moiety from the nano-scale wires 40, 42.

The M moiety should be highly conjugated and relatively compact. This compactness consideration tends to would favor the aromatic moieties for M over the conjugated alkyne moieties, and thus the aromatic moieties are preferred. Alkynes, being long and thus less rigid than aromatics, are more difficult to control and thus could possible short out the device. The arene rings can be in the molecular plane or perpendicular thereto. An example, depicting I=I'=$C_8$ hydrocarbon chain and two fused benzene rings, is illustrated below:

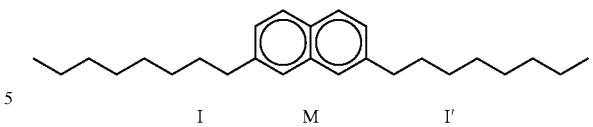

In one embodiment, a computing system for implementing at least one electronic circuit with gain is provided. The computing system comprises at least one two-dimensional molecular switch array 10, referring to FIG. 1. The molecular switch array 10 is formed by assembling two crossed planes of wires 12, 14 into a configuration of devices. Each device comprises a junction 16 formed by a pair of crossed wires where one wire crosses another and at least one connector species 24 connects the pair of crossed wires 20, 22 in the junction. The junction 16 has a functional dimension in nanometers (the distance between the two wires), includes a switching capability provided by one or more connector species 24 and the pair of crossed wires 20, 22, and has one set of wires formed above another set of wires. At least one of the devices on one of the molecular switch arrays 10 is configured to implement at least one of the electronic circuits. Specific connections are made to interconnect the devices and to connect the devices to two structures that provide voltages equal to a desired signal level for a high voltage level and a low voltage level.

The molecular switch arrays formed provide the advantages of economic fabrication and configuration of complex functional elements for the construction of computer systems. Continuing to refer to FIG. 1, the molecular switch array 10 may utilize more than one connector species 24 and forms a quantum state molecular switch 18 comprising an electrically adjustable tunnel junction between the two wires 20, 22. The molecular switch array 10 has one or more sets of wires 20, 22 formed to a thickness that is about the same size as the connector species 24, and over an order of magnitude longer than its diameter. Alternatively, the two wires 20, 22 both may have a thickness that is about the same size as the connector species 24. The two wires 20, 22 may also have a thickness that ranges from sub-micrometer to micrometer dimensions. The junction 18 of the molecular switch array 10 may function as a singly configurable or reconfigurable switch. Furthermore the junction 18 may comprise one of the elements selected from the group consisting of resistors, diodes, and transistors. The wires 20, 22 of the molecular switch array 10 independently comprise a conductor or semiconductor that is internally doped. The molecular switch array 10 further includes an insulating layer or a modulation-doped coating on at least one of the wires 20, 22, where the insulating layer comprises an oxide. The molecular switch array 10 further comprises one or more additional set of wires formed above a top-most set of wire and includes one or more connector species 24 between adjacent layers 12, 14 to connect crossed wire pairs. The connector species 24 may comprise a bi-stable molecule, such as, for example, a rotaxane or a molecule comprising a stator portion and a rotor portion, wherein the rotor portion can switch between two relatively stable states.

The molecular switch array 10 employs an array of chemically-fabricated wires 12, 14, or an array of nano-imprint, lithographically-formed wires. Examples of the latter approach are given in (1) U.S. Pat. No. 6,294,450, issued on Sep. 25, 2001, to Yong Chen et al and entitled "Nano-scale Patterning for the Formation of Extensive Wires", (2) U.S. Pat. No. 6,407,443, issued on Jun. 18, 2002, to Yong Chen et al and having the same title, and (3) U.S. Pat. No. 6,432,740, issued on Aug. 13, 2002, to Yong Chen and entitled "Fabrication of Molecular Electronic Circuit by Imprinting", all of which are assigned to the same assignee as the present application and all of which are expressly incorporated herein by reference The molecular switch array 10 further comprises one set of wires in a given layer that is separately formed and functionalized in a plurality of different ways to form a layer that is heterogeneous in wire type. The junction 16 of the molecular switch array 10 has a state that is altered by the application of a voltage. The junction 16 also has a state that is sensed by determining its resistance value.

Figure 5:
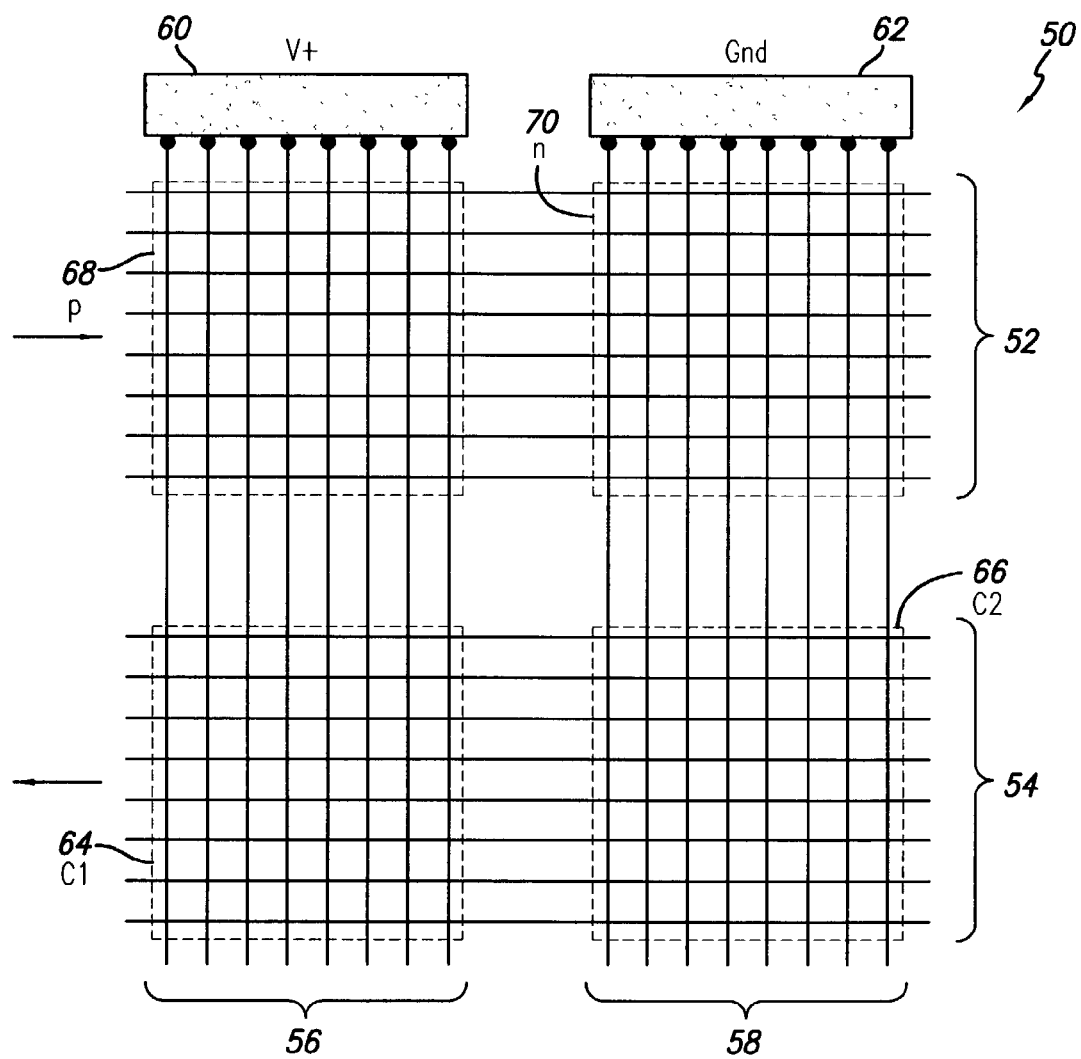
FIG. 5 is a schematic diagram of a configurable molecular switch array depicting the positioning of the conductive and semiconductor wires or nanowires and the division of the wires into four quadrants of configurable devices.

FIG. 5 depicts a configurable molecular switch array 50 that implements a array further depicting the positioning of the conductive wires 52, 54, the p-type semiconductor wires 56, and the n-type semiconductor wires 58. FIG. 5 also depicts the division of the wires 52, 54, 56, and 58 into four quadrants 64 ("C1"), 66 ("C2"), 68 ("p"), 70 ("n") of configurable devices, where each quadrant is capable of having different electrical properties The configurable molecular switch array 50, depicted in FIG. 5, comprises junctions 16 that form a configurable first set 64 and second set 66 of crossbar or crosspoint switches when the pair of crossed wires comprises a conductor wire crossing a p-type wire with an appropriate layer of molecules between them, or a conductor wire crossing an n-type wire with an appropriate layer of molecules between them. A p-type field effect transistor set 68 when the pair of crossed wires comprises one conductor 52 or 54 and one p-type semiconductor 56, with an appropriate molecular layer between them. An-type field effect transistor set 70 when the pair of crossed wires comprises one conductor 52 or 54 and one n-type semiconductor 58, with an appropriate molecular layer between them.

The configurable molecular switch array 50 has crossed planes of wires of a configuration of devices further comprising a first plane of wires having a first set of conductor wires 52 positioned parallel to a second set of conductor wires 54, and a second plane of wires having a first set of p-type semiconductor wires 56 positioned parallel to a second set of n-type semi-conductor wires 58, where the p-type semiconductor wires 56 connect to a first micrometer-scale structure 60 that supplies power (V+; a positive voltage with respect to ground) to the devices of the molecular switch array 50 and the n-type semiconductor wires 58 connect to a second micrometer-scale structure 62 that supplies a grounded connection (Gnd) to the devices of the molecular switch array 50.

The configurable molecular switch array 50 thus comprises a plurality of pairs of crossed wires and associated junctions and further comprises:
 (a) a configurable set 68 of p-type field effect transistors where the first set of conductor wires 52 of the first plane of wires cross the first set of p-type semiconductor wires 56 of the second plane of wires;
 (b) a configurable set 70 of n-type field effect transistors where the first set of conductor wires 52 of the first plane of wires cross the second set of n-type semiconductor wires 58 of the second plane of wires;
 (c) a first configurable set 64 of crosspoint switches where the second set of conductor wires 54 of the first plane of wires cross the first set of p-type semiconductor wires 56 of the second plane of wires; and
 (d) a second configurable set 66 of crosspoint switches where the second set of conductor wires 54 of the first plane of wires cross the second set of n-type semiconductor wires 58 of the second plane of wires.

The configurable molecular switch array 50 has a specific connectivity where the first configurable set 64 of crosspoint switches forms a first set of connections to the configurable set 68 of p-type field effect transistors and a second set of connections to the second set 66 of crossbar switches. The second configurable set 66 of crosspoint switches forms a first set of connections to the set 64 of crossbar switches and a second set of connections to the configurable set 70 of n-type field effect transistors, thus partitioning the devices of the configurable molecular switch array 50 to a configurable set of functional regions or quadrants. Each quadrant may have different electrical properties and different connector species 24, where the devices of the molecular array 50 are capable of being configured into functional sets 64, 66 of crosspoint switches, a set 68 of p-type field effect transistors and a set 70 of n-type field effect transistors to implement one or more electronic circuits with gain.

That is to say, there may be from one to four connector species 24. Use of one connector species would require a molecule having three or more states. More than one connector species simply requires molecules having two states. It may simply be expedient to use four different connector species 24, one for junctions forming p-type field effect transistors, one for junctions forming n-type field effect transistors, and two for junctions forming the two configurable crosspoint switches. Preferably, the connector species comprises three different species including one for junctions forming p-type field effect transistors, one for junctions forming n-type transistors and one for junctions forming both of the two configurable crosspoint switches. For two or more connecting species, confinement to the requisite quadrant is required. Advantageously, however, a quadrant is relatively large compared to the wire-to-wire spacing (pitch) of the nanowires, and confinement to specific quadrants can be done by conventional semiconductor masking techniques.

The configurable molecular switch array 50 has a first quadrant 68 that comprises the configurable set of p-type field effect transistors and is connected to the first micrometer-scale structure 60 that supplies power to the devices of the molecular switch array 50, the second quadrant 70 comprises the configurable set of n-type field effect transistors and is connected to the second micrometer-scale structure 62 that supplies the grounded connection to the devices of the molecular switch array 50, the third quadrant 64 comprises the first configurable set of the crosspoint switches, and the fourth quadrant 66 comprises the second configurable set of the crosspoint switches.

The architecture of the molecular switch array 50 is very tolerant of fabrication-induced defects. The configurable molecular switch array 50 includes a means for characterizing the junctions of the molecular switch array 50 to identify any defects in the wires and the junctions, see U.S. Pat. No. 5,790,771, "Apparatus and Method for Configuring a Reconfigurable Electronic System Having Defective Resources", issued to W. Bruce Culbertson et al on Aug. 4, 1998, and assigned to the same assignee as the present invention, which is incorporated in its entirety by reference.

That invention provides a defect detection arrangement to detect the defective resources among all resources. The detection arrangement configures the resources into a number of test systems, each having a number of resources. The detection arrangement then tests and determines if each of the test systems is operational. Each resource within each of the operational test systems is then identified as non-defective. The detection arrangement then reconfigures the resources into a number of different test systems (i.e., combining different groups of resources into test systems each time) and repeats the process until substantially every one of the resources except the defective resource has been identified as non-defective.

Figure 6:
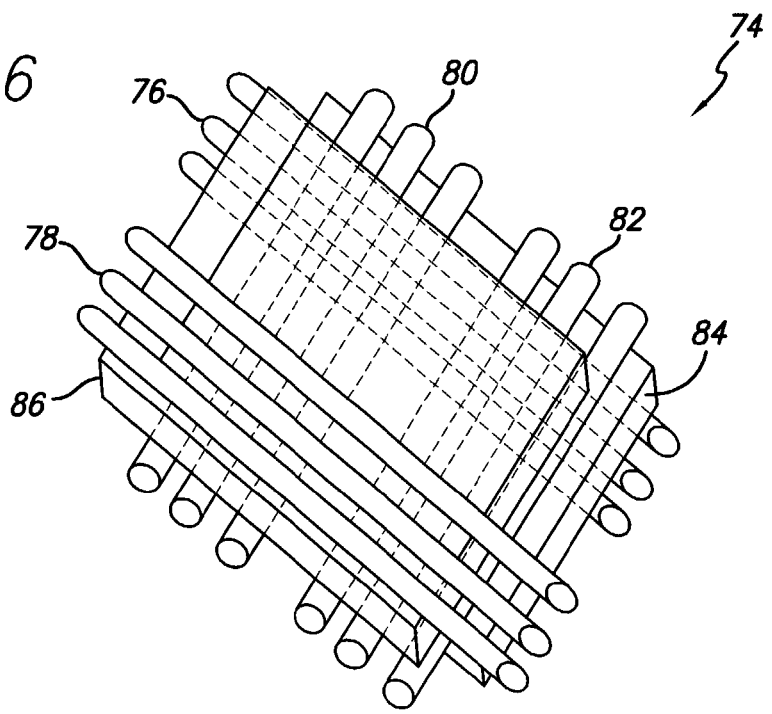
FIG. 6 is an illustration of the stacking of two or more crossed planes of wires forming a configuration of devices and more particularly depicts a top view of a three plane configuration.

FIG. 6 is an illustration of the stacking of three crossed planes of wires 74, in the specific case where there are two connector species 24, one of which forms a switch and the other of which forms a configurable transistor, as previously defined. The illustration depicts a perspective view of the three plane configuration 74 where wires including conductive nanowires 76 (plane 1), and conductive nanowires 78 (plane 3), are oriented perpendicularly to p-type semiconductor wires 80 and n-type semiconductor wires 82 (plane 2), and have one or more molecular monolayers deposited between any two adjacent layers of the wires. For example, the three plane configuration 74, has a transistor molecular layer 84 deposited between conductive nanowires 76 and semiconductor nanowires 80 and 82, and a switch molecular layer 86 deposited between conductive nanowires and semiconductor nanowires 80 and 82. While the semiconductor wires have to be nanowires, the conductive wires do not have to be nanowires. The major virtue of doing the foregoing is that the molecular layers 84 and 86 need not be confined to specific quadrants, but can each have arbitrary lateral extent, so long as they are isolated from each other vertically.

Figure 7A:
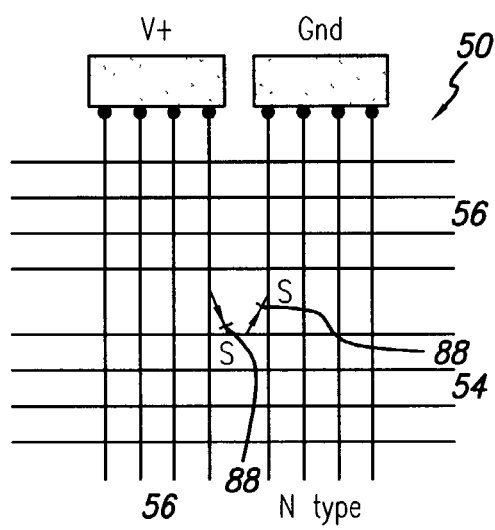
FIG. 7a is a schematic diagram of a configurable array similar to FIG. 5, but depicting the formation of Schottky diodes having a direction such that they do not interfere with the correct logical operation of the gates formed within the array.

FIG. 7a is a schematic diagram of a configurable array 50 similar to FIG. 5 but depicting the formation of Schottky diodes 88 at the semi-conductor/metal junctions. However, the directions of the diodes 88 are such that they do not interfere with the correct logical operation of logic gates formed within the array 50.

Figure 7B:
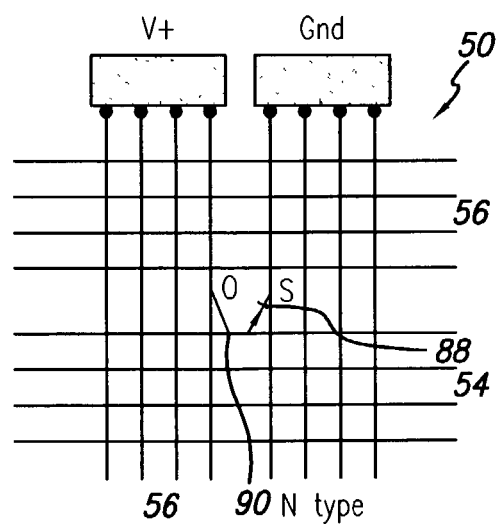
FIG. 7b is a schematic diagram of a configurable array similar to FIG. 7a, but depicting the formation of essentially ohmic diodes at the semiconductor/metal junctions when conductive wire joins p-type semiconductor wires.

FIG. 7b is a schematic diagram of a configurable array 50 similar to FIG. 7a, but depicting the formation of essentially ohmic diodes 90 at the semiconductor/metal junctions when aluminum joins p-type semiconductor wires. It will be noted, however, that the single Schottky diode 88 does not interfere with the logical operation of gates configured within the array 50.

Figure 8A:
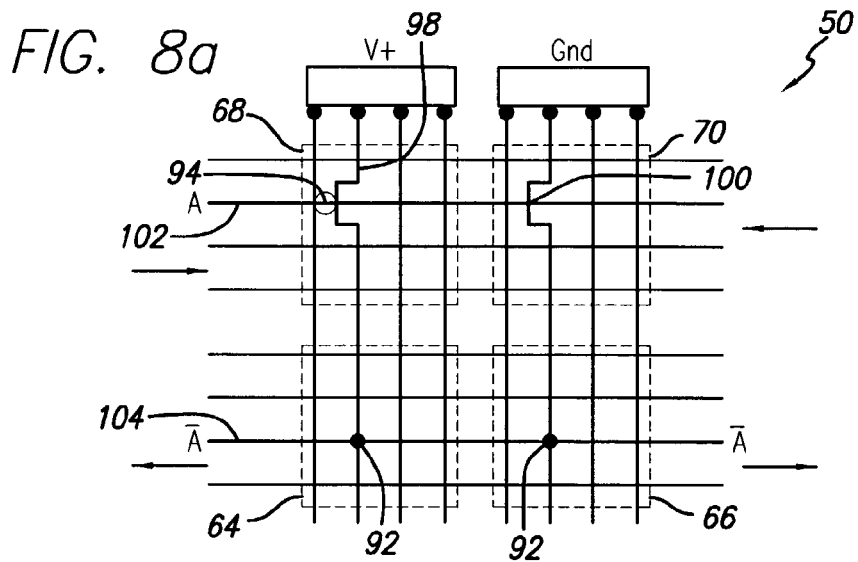
FIG. 8a illustrates a specific connection of the molecular switch array devices depicted in FIG. 5 to implement an inverter having one junction in each quadrant.

The configurable molecular switch array 50 can be configured to implement a variety of electronic circuits including digital circuits ranging from a simple inverter circuit to more complex electronic circuits such as digital signal processors, and analog circuits including amplifiers, neural networks and analog to digital converters. FIGS. 8a, 8b, 8c, and 9 depict examples of digital electronic circuits implemented using the configurable molecular switch array 50. FIG. 8a illustrates a specific connection of the devices of molecular switch array 50 depicted in FIG. 5 to implement an inverter having one junction in each quadrant. Two junctions in quadrants 64 and 66 are configured to be closed crosspoint switches 92. The p-type field effect transistor (pFET) symbol 94 in quadrant 68 represents a junction configured to be a pFET, with the horizontal wire 96 of the junction performing the function of the gate, and the vertical wire 98 the source and drain. The n-type field effect transistor (nFET) symbol 100 in quadrant 70 represents a junction configured to be an nFET. With this configuration, an input signal, "A" 102, connects to the gates of the configured pFET 94 and nFET 100. The two FETs are also connected with closed crosspoint switches 92 in the two lower quadrants 64, 66. The result is a circuit that implements a CMOS-like inverter. The inverted output, "NOT A" 104 is then available to be routed outside of the configurable molecular switch array 50.

Figure 8B:
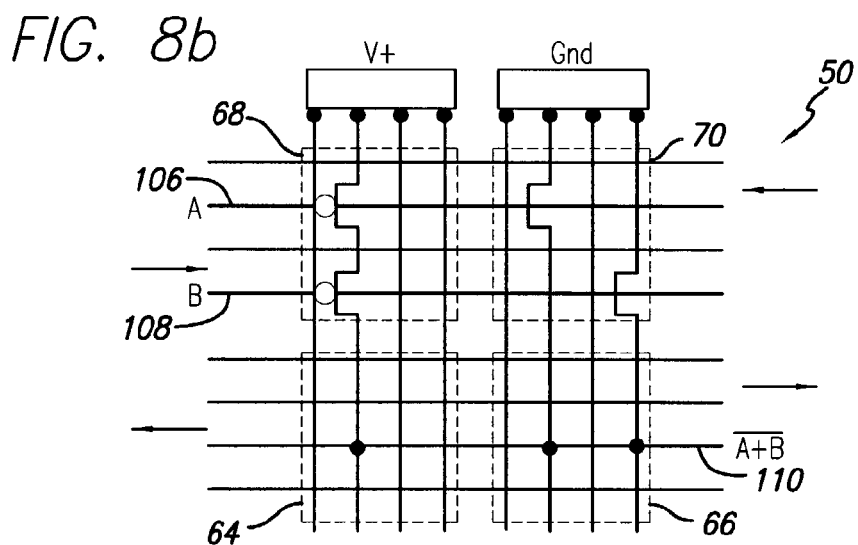
FIG. 8b illustrates a specific connection of the molecular switch array devices depicted in FIG. 5 to implement a two input logical NOR gate.

FIG. 8b illustrates a specific connection of the devices of the configurable molecular switch array 50 depicted in FIG. 5 to implement a two input logical NOR gate. It will be noted that the signals A 106 and B 108 can be routed to the upper quadrants 68, 70 from either the left or right side of the top half of the array 50. The array 50 is indifferent as to which wires are used in the upper quadrants 68, 70 for routing the input signals to the nFETs and pFETs. Similarly, once the input wires for A 106 and B 108 have been selected, the array 50 is indifferent as to which "FET chain" is used in quadrant 68, and which FETs are selected in quadrant 70. It is also indifferent as to the horizontal wire used in quadrants 64, 66. Typically, the selection of FETs and wires would likely be driven by decisions about which wires should be used for the output signal NOT (A OR B) 110. The entire structure is extremely routable and defect-tolerant.

Figure 8C:
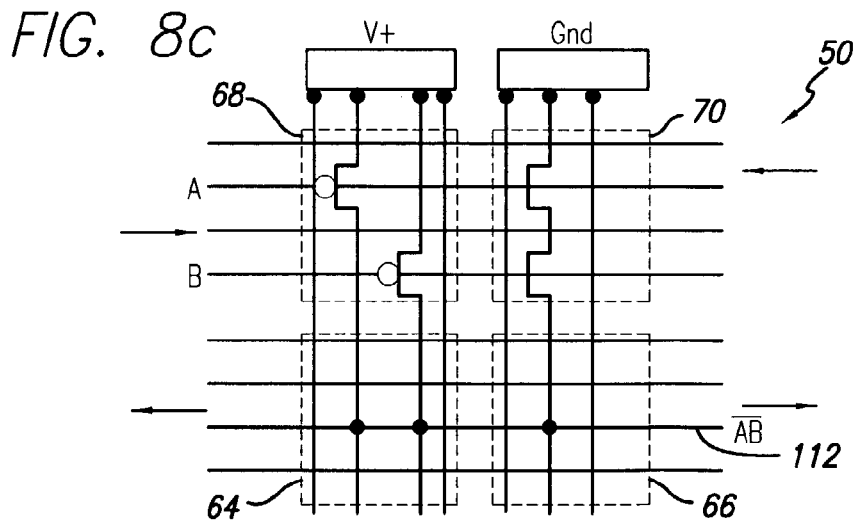
FIG. 8c illustrates a specific connection of the molecular switch array devices depicted in FIG. 5 to implement a two input NAND gate.
Figure 9:
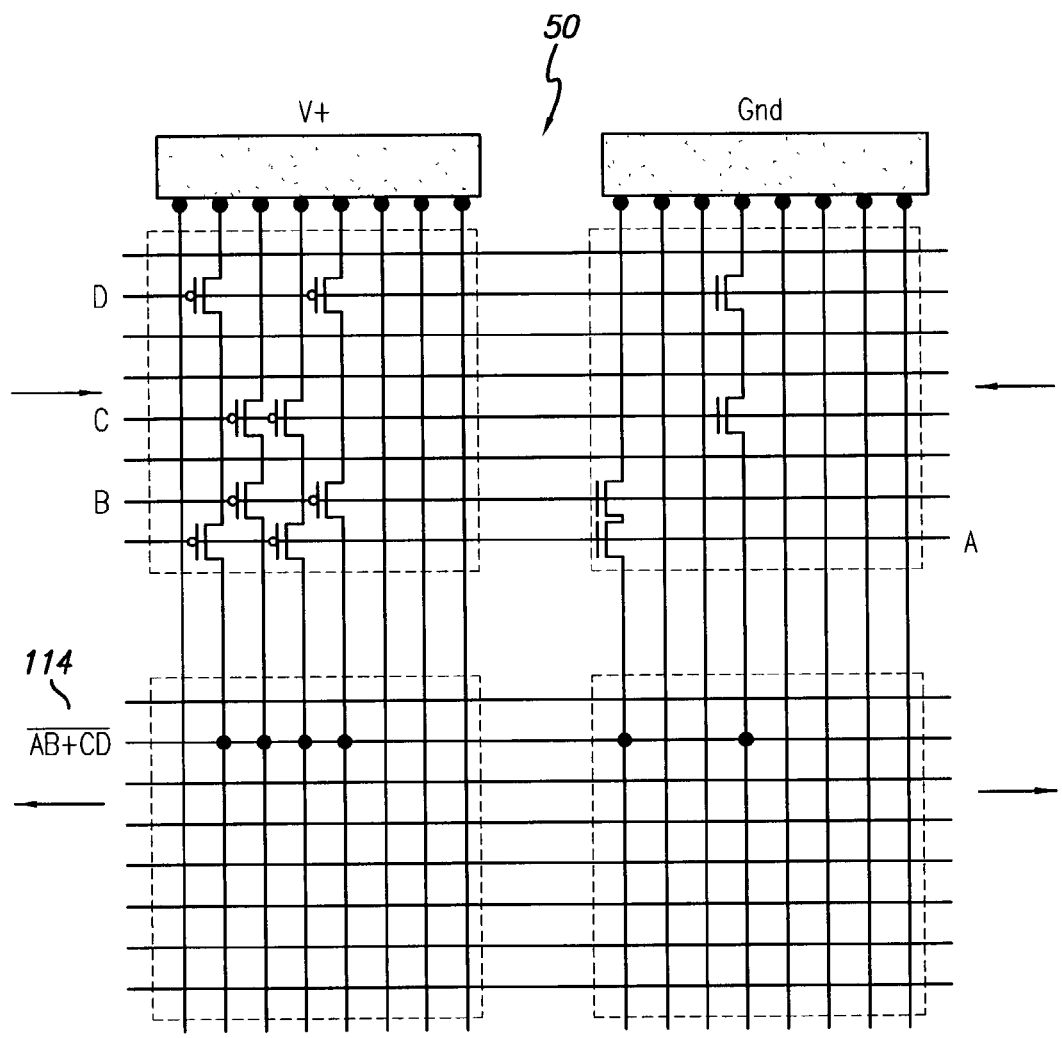
FIG. 9 illustrates a specific connection of the molecular switch array devices depicted in FIG. 5 to implement more complex electronic circuits such as the AND-OR-INVERT gate as a single gate.

FIG. 8c illustrates that the configurable molecular switch array 50 can be use to implement a NAND gate 112 as easily as a NOR 110 and FIG. 9 illustrates that even move complex logical functions can be implemented. The "AND-OR-INVERT" gate 114 shown here is not a cascade of two AND gates followed by a NOR gate, but rather a single gate.

Figure 10:
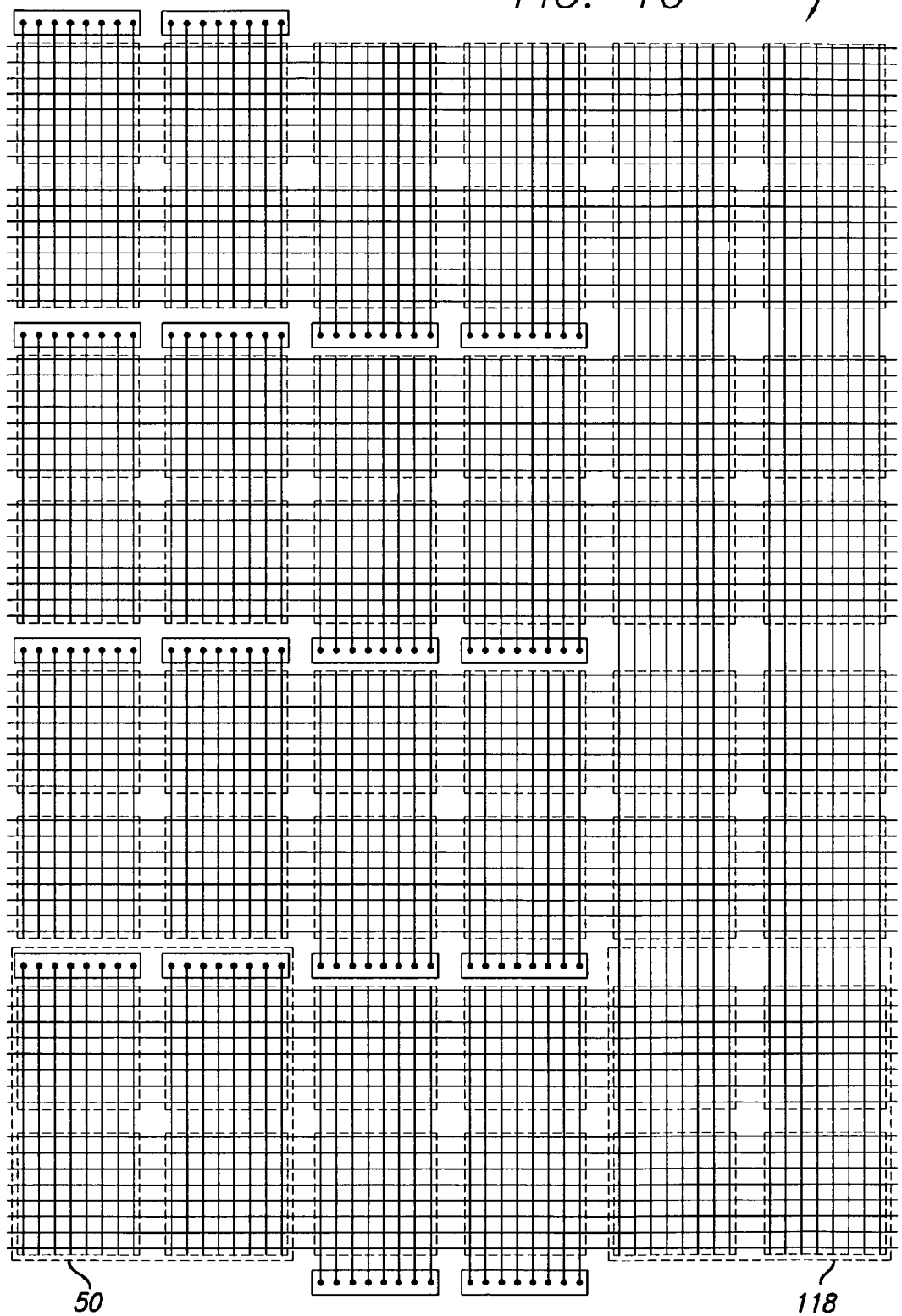
FIG. 10 illustrates the use of reflection and rotation of multiple molecular switch arrays, as depicted in FIG. 5, and programmable crossbars to form a larger tiled structure.
Figure 11:
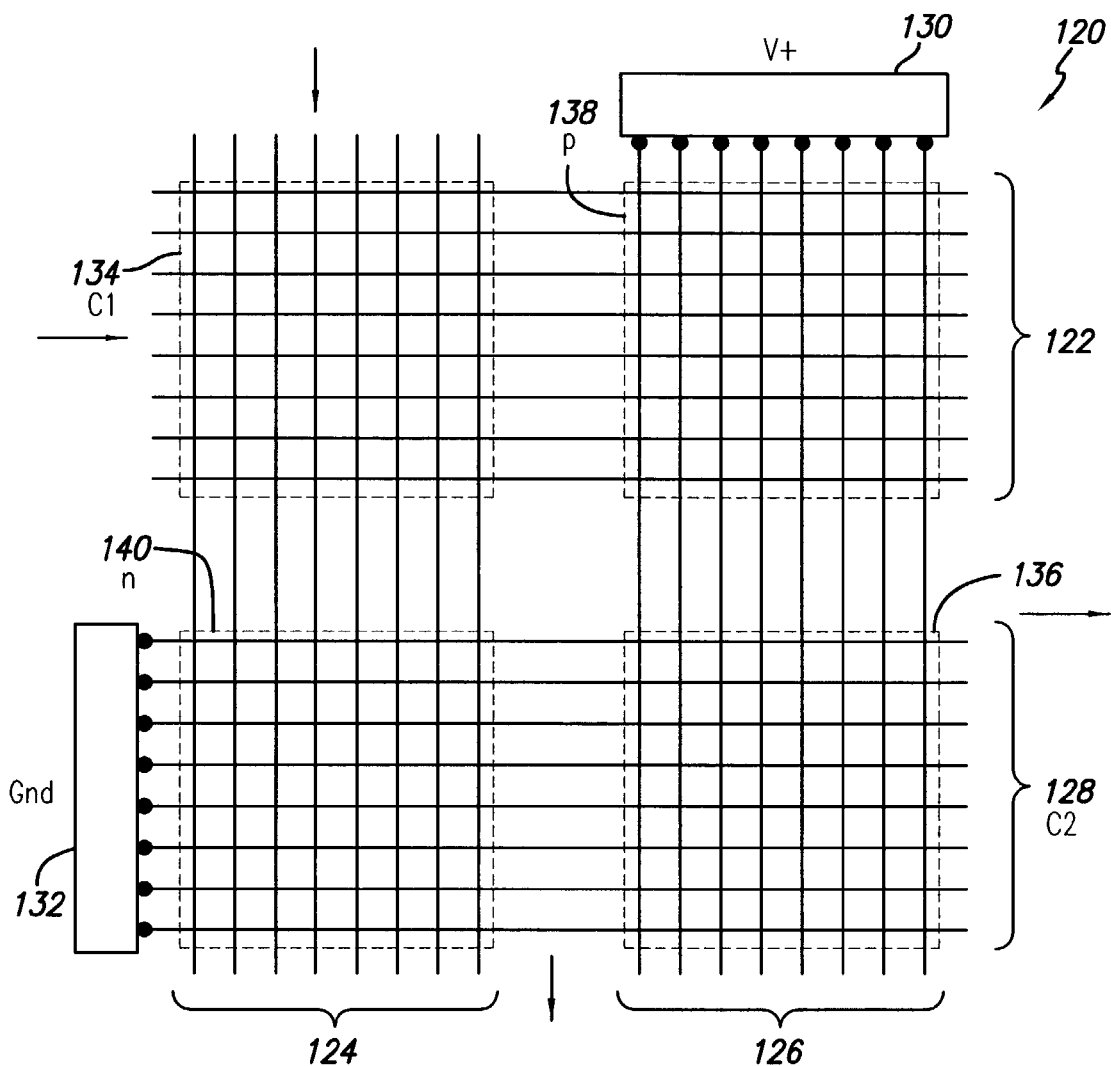
FIG. 11 is a schematic diagram of a configurable molecular switch array similar to FIG. 5, but depicting a different positioning of the conductive and semiconductor wires or nanowires, and the division of the wires into four quadrants of configurable devices.

FIG. 10 illustrates the use of reflection and rotation of two different multiple super-quadrants 50, 118, to form a larger two-dimensional tiled array 116, where a first super-quadrant 50 comprises four molecular switch arrays and a second super-quadrant 118 comprises four programmable crossbars. It will be readily apparent to one skilled in this art that other tiled arrays may be created by assembling super-quadrants with appropriate reflections and rotations FIG. 11 depicts an alternative configurable molecular switch array 120 that implements a array further depicting the positioning of the conductive wires 122, 124, the p-type semiconductor wires 126 and the n-type semiconductor wires 128. FIG. 11 also depicts the division of the wires 122, 124, 126, and 128 into four quadrants 134 ("C1"), 136 ("C2"), 138 ("p"), 140 ("n") of configurable devices where each quadrant is capable of having different electrical properties. The same considerations regarding the number of connector species 24 as in FIG. 5 obtain here as well.

The configurable molecular switch array 120 comprises junctions 16 that form a configurable first set 134 and second set 136 of crossbar or crosspoint switches when the pair of crossed wires is comprised of two conductors; a p-type field effect transistor set 138 when the pair of crossed wires is comprised of one conductor 122 and one p-type semiconductor 126; and an n-type field effect transistor set 140 when the pair of crossed wires is comprised of one conductor 124 and one n-type semiconductor 128.

The configurable molecular switch array 120 has crossed planes of wires of a configuration of devices further comprising a first plane of wires having a first set of conductor wires 122 positioned parallel to a second set of n-type semiconductor wires 128, and a second plane of wires having a first set of conductor wires 124 positioned parallel to a second set of p-type semi-conductor wires 126, where the p-type semiconductor wires 126 connect to a first micrometer-scale structure 130 that supplies power (V+) to the devices of the molecular switch array 120 and the n-type semiconductor wires 128 connect to a second micrometer-scale structure 132 that supplies a grounded connection (Gnd) to the devices of the molecular switch array 120.

The configurable molecular switch array 120 thus comprises a plurality of pairs of crossed wires and associated junctions and further comprises:
(a) a first configurable set 134 of crosspoint switches where the first set of conductor wires 122 of the first plane of wires cross the first set of conductor wires 124 of the second plane of wires;
(b) a configurable set 138 of p-type field effect transistors where the first set of conductor wires 122 of the first plane of wires cross the second set of p-type semiconductor wires 126 of the second plane of wires;

(c) a configurable set 140 of n-type field effect transistors where the second set of n-type semiconductor wires 128 of the first plane of wires cross the first set of conductor wires 124 of the second plane of wires; and (d) a second configurable set 136 of crosspoint switches where the second set of n-type semiconductor wires 128 of the first plane of wires cross the second set of p-type semiconductor wires 126 of the second plane of wires.

The configurable molecular switch array 120 has a specific connectivity where the first configurable set 134 of the crosspoint switches forms a first set of connections to the configurable set 138 of p-type field effect transistors and a second set of connections to the configurable set 140 of n-type field effect transistors. The second configurable set 136 of crosspoint switches forms a first set of connections to the configurable set 138 of p-type field effect and a second set of connections to the configurable set 140 of n-type field effect transistors, thus partitioning the devices of the molecular switch array 120 into a configurable set of functional regions or quadrants, each having different electrical properties and different connector species, where the devices of the molecular array 120 are capable of being configured into functional sets of 134, 136 crosspoint switches, a set 138 of p-type field effect transistors and a set 140 of n-type field effect transistors to implement one or more electronic circuits with gain.

The configurable molecular switch array 120 has a first quadrant 134 that comprises the configurable set of crosspoint switches, the second quadrant 138 comprises the configurable set of p-type field effect transistors and is connected to the first micrometer-scale structure 130 that supplies power to the devices of the molecular switch array 120, the third quadrant 140 comprises the configurable set of n-type field effect transistors and is connected to the second micrometer-scale structure 132 that supplies the grounded connection to the devices of the molecular switch array 120, and the fourth quadrant 136 comprises the second configurable set of crosspoint switches.

The architecture of the molecular array 120, like that of molecular array 50, is very tolerant of fabrication-induced defects and includes a means for characterizing the junctions of the molecular switch array 120 to identify defects in the wires and the junctions as previously described by reference to Culbertson et al.

Figure 12A:
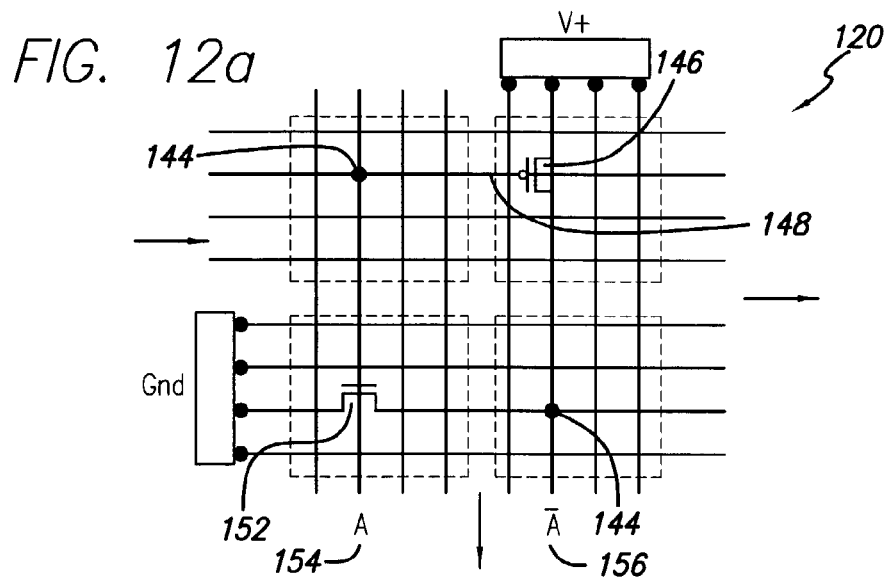
FIG. 12a illustrates a specific connection of the molecular switch array devices depicted in FIG. 11 to implement an inverter having one junction in each quadrant.

The alternative configurable molecular switch array 120 can also be configured to implement a variety of electronic circuits ranging from a simple inverter circuit to more complex electronic circuits. FIG. 12a illustrates a specific connection of the devices of molecular switch array 120 depicted in FIG. 11 to implement an inverter having one junction in each quadrant. Two junctions in quadrants 134 and 136 are configured to be closed crosspoint switches 144. The p-type field effect transistor (pFET) symbol 146 in quadrant 138 represents a junction configured to be a pFET, with the horizontal wire 148 of the junction performing the function of the gate, and the vertical wire 156 the source and drain. The n-type field effect transistor (nFET) symbol 152 in quadrant 140 represents a junction configured to be an nFET. With this configuration, an input signal, "A" 154, connects to the gates of the configured pFET 146 and nFET 152. The two FETs are interconnected with closed crosspoint switches 144 in the two quadrants 134, 136. The result is a circuit that implements a CMOS-like inverter. The inverted output, "NOT A" 156 is then available to be routed outside of the configurable molecular switch array 120.

Figure 12B:
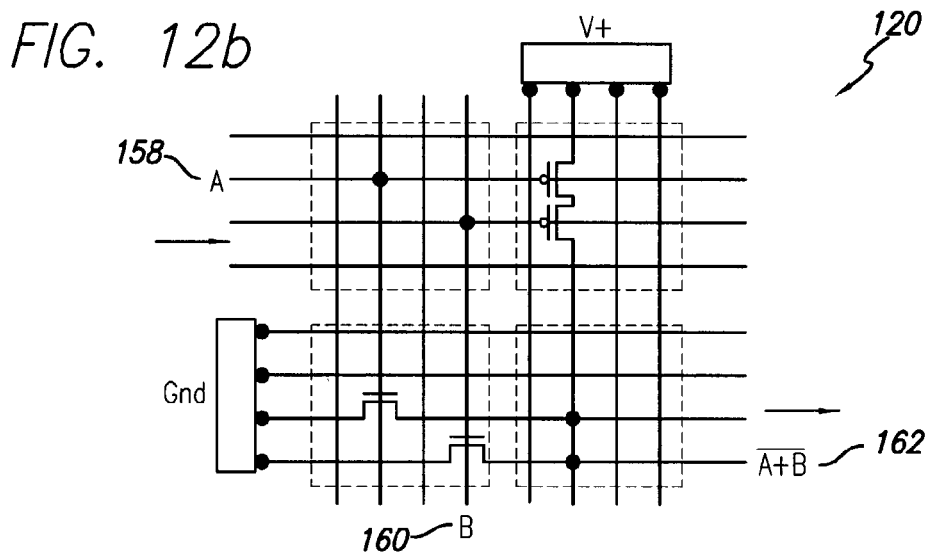
FIG. 12b illustrates a specific connection of the molecular switch array devices depicted in FIG. 11 to implement a two input logical NOR gate.

FIG. 12b illustrates a specific connection of the devices of the configurable molecular switch array 120 depicted in FIG. 11 to implement a two input logical NOR gate. Notice that the signals A 158 and B 160 can be routed to the upper quadrants 134, 138 from either the left or right side of the top half of the array 120. The array 120 is indifferent as to which wires are used in the upper quadrants 134, 138 for routing the input signals to the nFETs and pFETs. Similarly, once the input wires for A 158 and B 160 have been selected, the array 120 is indifferent as to which "FET chain" is used in quadrant 138, and which FETs are selected in quadrant 140. It is also indifferent as to the horizontal wire used in quadrant 134. Typically, the selection of FETs and wires would likely be driven by decisions about which wires should be used for the output signal NOT (A OR B) 162. The entire structure is extremely routable and defect-tolerant.

Figure 12C:
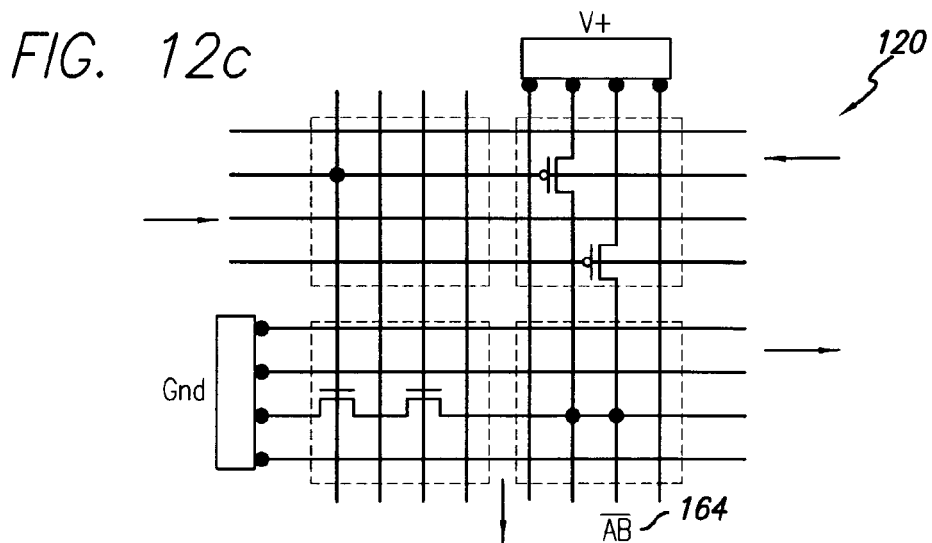
FIG. 12c illustrates a specific connection of the molecular switch array devices depicted in FIG. 11 to implement a two input NAND gate.
Figure 13:
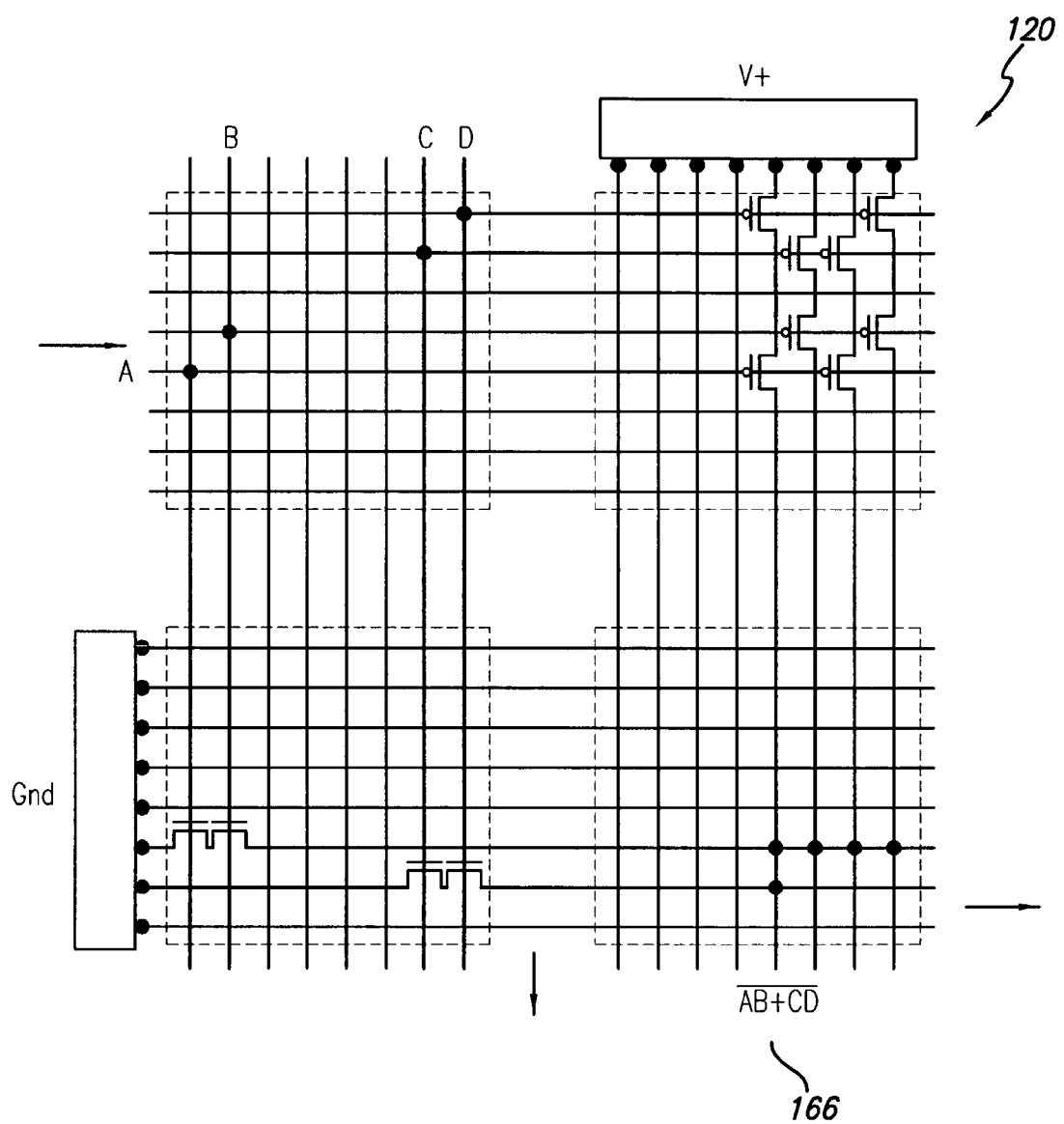
FIG. 13 illustrates a specific connection of the molecular switch array devices depicted in FIG. 11 to implement more complex electronic circuits such as the AND-OR-INVERT gate as a single gate.

FIG. 12c illustrates that the configurable molecular switch array 120 can be use to implement a NAND gate 164 as easily as a NOR 162. FIG. 13 illustrates that even move complex logical functions can be implemented. The "AND-OR-INVERT" gate 114 shown here is not a cascade of two AND gates followed by a NOR gate, but rather a single gate.

Figure 14:
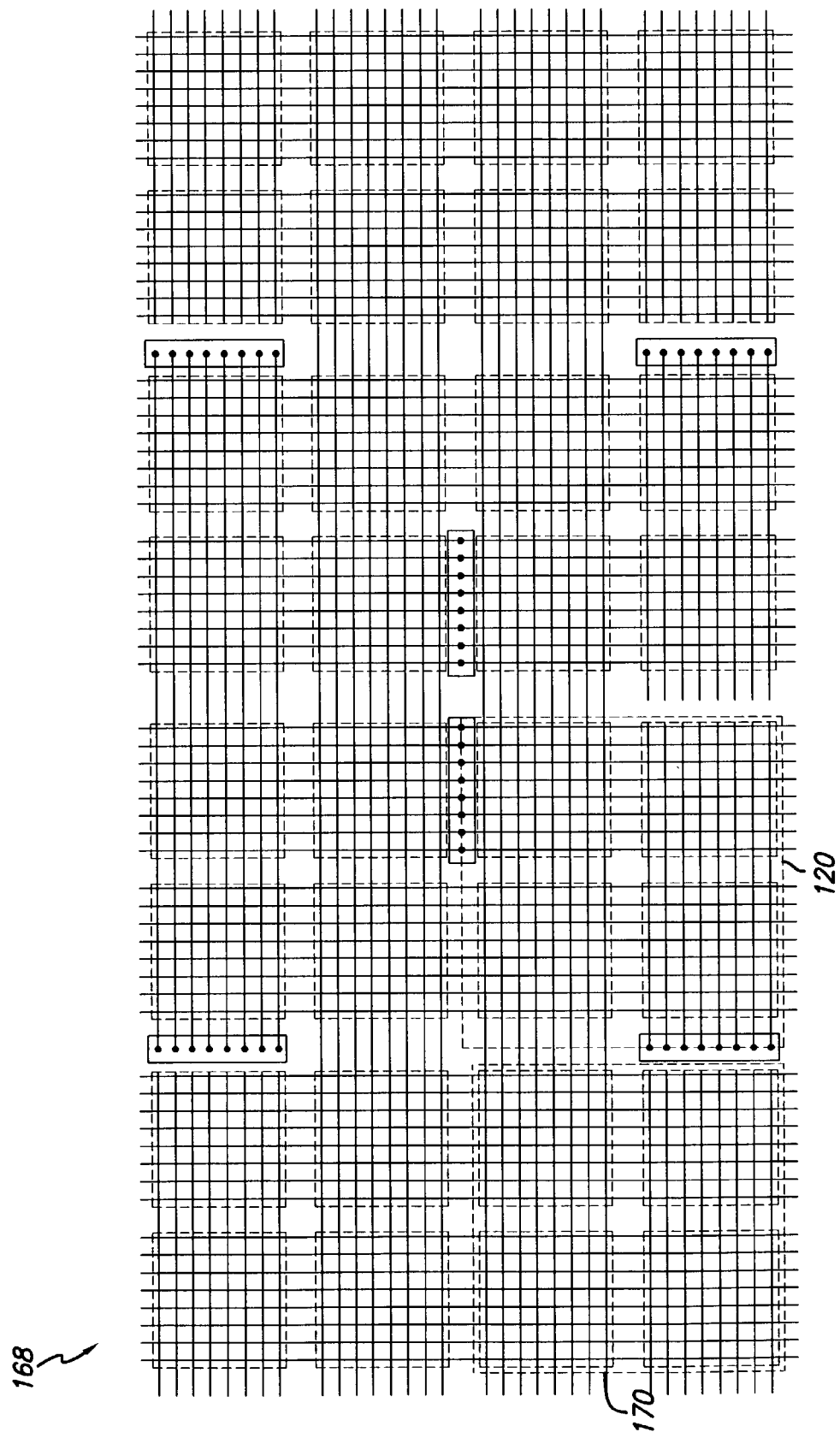
FIG. 14 illustrates the use of reflection and rotation of multiple molecular switch arrays, as depicted in FIG. 11, and programmable crossbars to form a larger tiled structure.

FIG. 14 illustrates the use of reflection and rotation of two different multiple super-quadrants 120, 170, to form a larger two-dimensional tiled array 168, where a first super-quadrant 120 comprises four molecular switch arrays and a second super-quadrant 170 comprises four programmable crossbars. It will be readily apparent to those skilled in this art that other tiled arrays may be created by assembling multiple super-quadrants with appropriate reflections and rotations.

Figure 15:
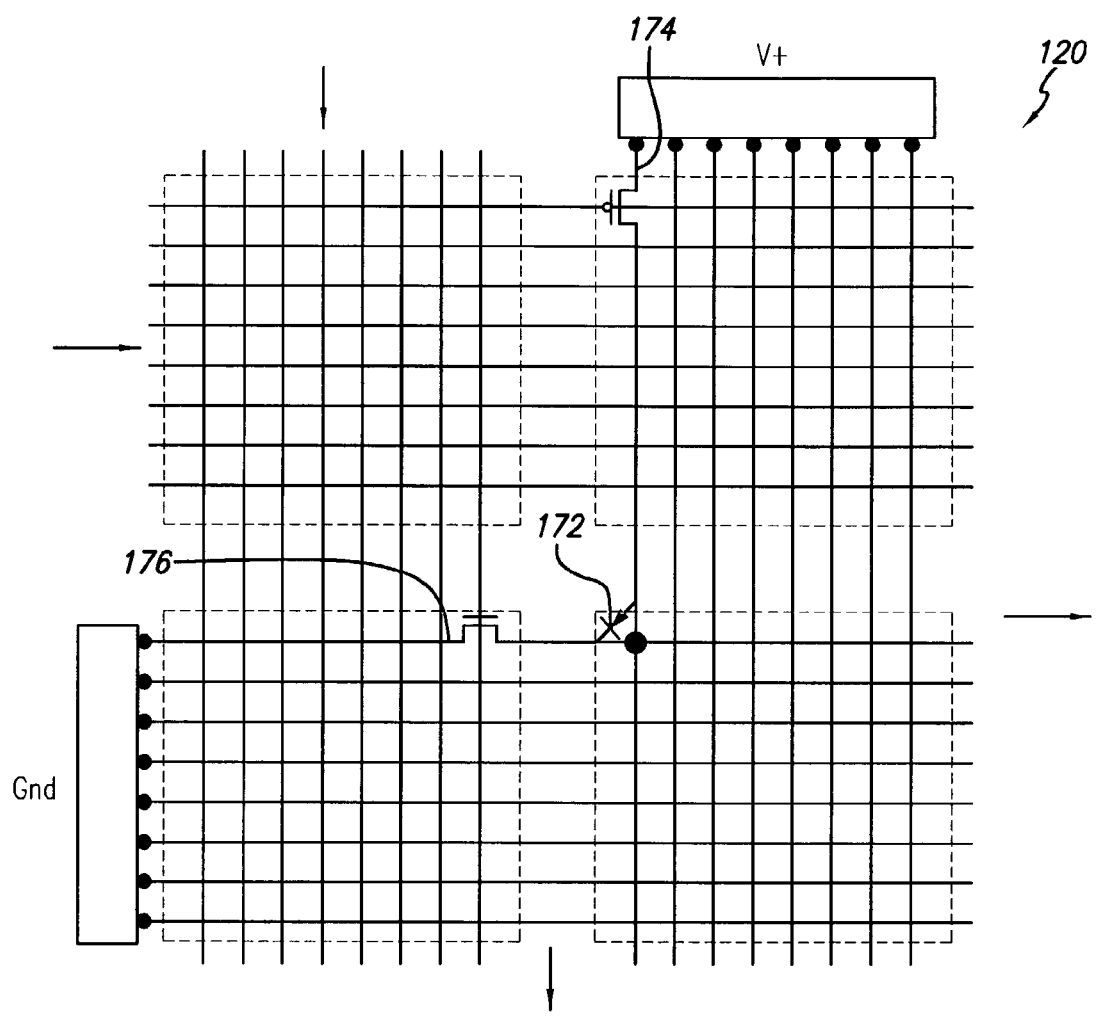
FIG. 15 is a schematic diagram of a configurable molecular switch array similar to FIG. 11, depicting the formation of a diode by joining a p-type vertical wire with the n-type horizontal wire in the right lower quadrant that does not interfere with the correct functioning of the gates configured in the array because of the "push-pull" nature of the configured field effect transistors.

FIG. 15 is a schematic diagram of a configurable array similar to FIG. 11, depicting the formation of a diode 172 by joining a p-type vertical wire 174 with the n-type horizontal wire 176 in the right lower quadrant that does not interfere with the correct functioning of the gates configured in the array because of the "push-pull" nature of the configured field effect transistors. When there is no input to the n-type FET 176, then the n-FET remains open and no current flows through the diode 172, thus, the output of the FET chain is pulled up to the value of the voltage source 130, V+. When there is an input to the n-FET 176, then the n-FET switches to a closed state and effectively allows current to flow from the p-FET 174 through the diode 172 and the output voltage is pulled down below the value of V+.

In an alternative embodiment, a configurable molecular switch array for creating logic circuits comprises a specific interconnection of one or more nanometer-scale devices where each device further comprises a configurable p-type field effect transistor, a n-type transistor, or a configurable crosspoint switch, and two micrometer-scale structures that supply power and ground connections to the devices of the array. Alternatively, the devices of the array may comprise a pnp-type bipolar transistor, an npn-type bipolar transistor, or a configurable crosspoint switch. The array may be configured to implement a variety of logical functions ranging from a simple inverter circuit to complex logical functions.

Thus, there has been disclosed a configurable molecular switch array comprising a plurality of nanometer-scale devices having junctions formed by crossed wires joined by bi-stable molecules at the intersecting junctions. It will be apparent to those skilled in this art that various changes and modifications of an obvious nature may be made, and all such changes and modifications are considered to fall within the scope of the appended claims.

What is claimed is:

1. A computing system for implementing at least one electronic circuit with gain comprising:

at least one two-dimensional molecular switch array, said molecular switch array formed by assembling two or more crossed planes of wires into a configuration of devices, said device comprising a junction formed by a pair of crossed wires where one wire crosses another and at least one connector species connecting said pair of crossed wires in said junction, said junction having a functional dimension in nanometers and at least one switching capability provided by both (1) at least one connector species and said pair of crossed wires and (2) a configurable nano-scale wire transistor having a first state that functions as a transistor and a second state that functions as a conducting semiconductor wire; and at least one of said devices on one of said molecular switch arrays is configured to implement at least one of said electronic circuits, wherein specific connections are made to interconnect said devices and to connect said devices to two structures that provide voltages equal to a desired signal level for a high voltage level and a low voltage level;

wherein said nano-scale wire transistor comprises (a) a pair of crossed nanowires that form an intersection, one of said nanowires comprising a semiconductor material and another of said nanowires comprising either a metal or a second semiconductor material, and (b) a hot electron trap region associated with said intersection for controlling conductance of each associated transistor, thereby forming a configurable transistor or a switch memory bit that is capable of being set by application of a voltage that is larger in absolute magnitude than any voltage at which said transistor operates;

wherein said hot electron trap region comprises a member selected from the group consisting of (1) a molecular species associated with said first wires and said second wires, (2) a dielectric layer on either said first wires, said second wires, or both, and (3) a dielectric layer above, below, or between said first wires and said second wires:

wherein said hot electron trap region comprises a molecular species configured between said first wires and said second wires;

wherein said molecular species comprises a molecule having the structure represented by

I-M-I', where M represents a conjugated moiety having a relatively smaller HOMO-LUMO value and where I and I' represent an insulator portion of the molecule that is connected to said first wires and second wires, with I and I' the same or different and having a relatively higher HOMO-LUMO value.

2. The nano-scale wire transistor of claim 1 wherein I, I' is a long carbon chain moiety that is non-conjugated and wherein M is a conjugated moiety.

3. The nano-scale wire transistor of claim 2 wherein I, I' is a carbon chain of greater than 6 carbon atoms and has a $\Delta E_{HOMO/LUMO}$ value of about 3 to 6 eV.

4. The nano-scale wire transistor of claim 2 wherein M is selected from the group consisting of a benzene ring, polyacenes, and polyacetylene and has a $\Delta E_{HOMO/LUMO}$ value of about 1 to 2 eV.

* * * * *

UNITED STATES PATENT AND TRADEMARK OFFICE
CERTIFICATE OF CORRECTION

| | | |
|---|---|---|
| PATENT NO. | : 8,004,876 B2 | Page 1 of 1 |
| APPLICATION NO. | : 10/233232 | |
| DATED | : August 23, 2011 | |
| INVENTOR(S) | : Gregory S. Snider et al. | |

It is certified that error appears in the above-identified patent and that said Letters Patent is hereby corrected as shown below:

In column 16, line 6, in Claim 1, delete "wires:" and insert -- wires; --, therefor.

Signed and Sealed this
Tenth Day of April, 2012

David J. Kappos
*Director of the United States Patent and Trademark Office*